(12) United States Patent
Desai et al.

(10) Patent No.: US 6,433,565 B1
(45) Date of Patent: Aug. 13, 2002

(54) TEST FIXTURE FOR FLIP CHIP BALL GRID ARRAY CIRCUITS

(75) Inventors: Kishor V. Desai, Fremont; Maniam Alagaratnam, Cupertino; Sunil A. Patel, Los Altos, all of CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/846,435

(22) Filed: May 1, 2001

(51) Int. Cl.[7] .............................................. G01R 31/02
(52) U.S. Cl. ...................................... 324/755; 324/765
(58) Field of Search ................................. 324/755, 760, 324/765, 758; 439/65, 66, 81, 83; 361/760, 764, 765

(56) References Cited

U.S. PATENT DOCUMENTS

| | | | | | |
|---|---|---|---|---|---|
| 5,800,184 A | * | 9/1998 | Lopergolo et al. | ............ | 439/66 |
| 5,880,590 A | * | 3/1999 | Desai et al. | ................ | 324/755 |
| 6,050,832 A | * | 4/2000 | Lee et al. | ..................... | 439/66 |
| 6,062,873 A | * | 5/2000 | Kato | ............................ | 439/66 |
| 6,081,429 A | * | 6/2000 | Barrett | ........................ | 324/755 |
| 6,084,297 A | * | 7/2000 | Brooks et al. | ............... | 257/698 |
| 6,133,064 A | * | 10/2000 | Nagarajan et al. | .......... | 438/106 |
| 6,242,932 B1 | * | 6/2001 | Hembree | .................... | 324/755 |
| 6,344,684 B1 | * | 2/2002 | Hussain et al. | ............. | 324/755 |
| 6,373,273 B2 | * | 4/2002 | Akaram et al. | ............. | 324/755 |

* cited by examiner

Primary Examiner—Michael Sherry
Assistant Examiner—Jermele Hollington
(74) Attorney, Agent, or Firm—Fitch, Even, Tabin & Flannery

(57) ABSTRACT

A test fixture for a ball grid array package is disclosed that includes a test ball grid array package having a plurality of coarse pitch contacts formed on a coarse pitch surface of the test ball grid array package and a plurality of wafer bumps formed on a fine pitch surface of the test ball grid array package and an interposer coupled to the plurality of wafer bumps formed on the fine pitch surface of the test ball grid array package for coupling to a plurality of wafer bumps formed on a fine pitch surface of a subject ball grid array package.

7 Claims, 1 Drawing Sheet

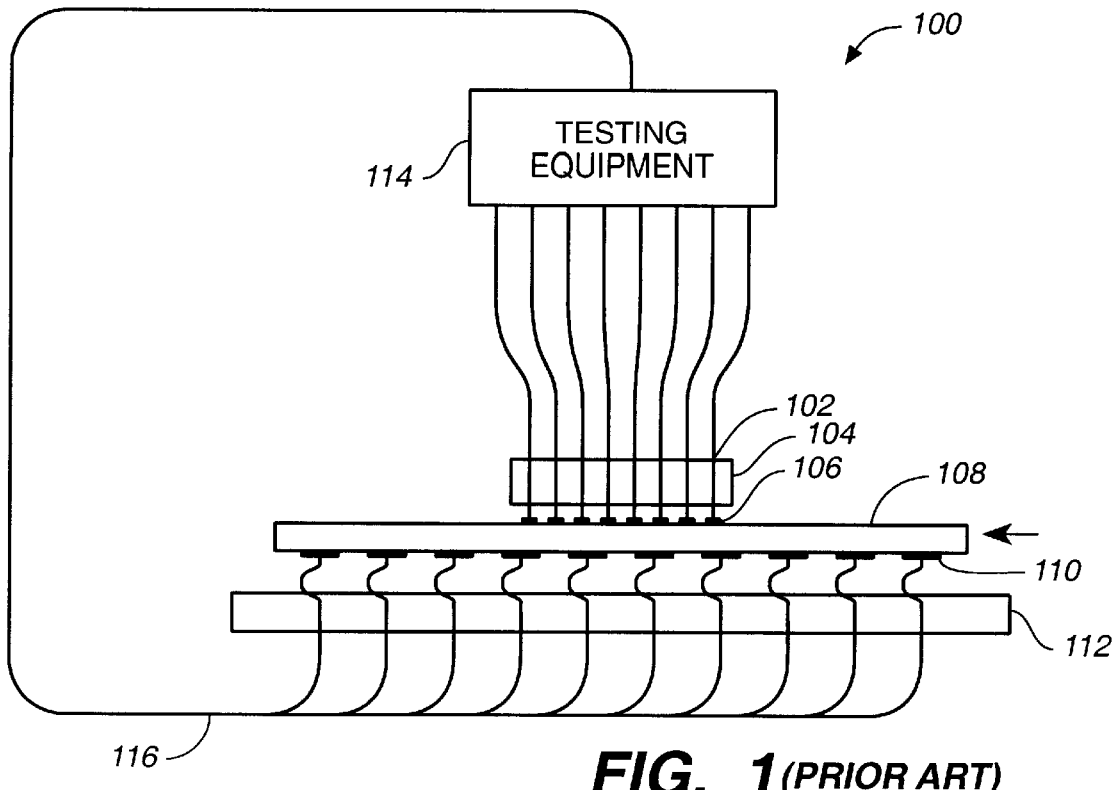
FIG._1 (PRIOR ART)
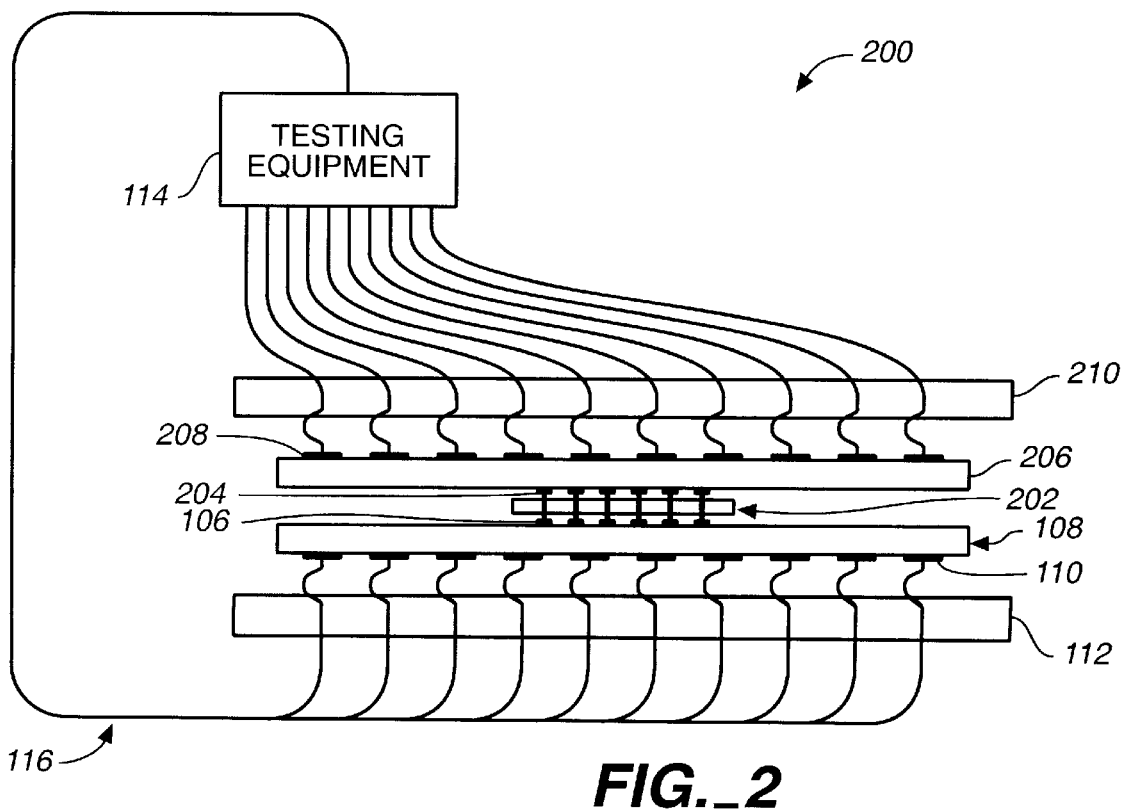
FIG._2

TEST FIXTURE FOR FLIP CHIP BALL GRID ARRAY CIRCUITS

BACKGROUND OF THE INVENTION

The present invention relates generally to testing of flip chip ball grid array (FCBGA) integrated circuits. More specifically, but without limitation thereto, the present invention relates to a test fixture for detecting open and short defects in a flip chip ball grid array package.

The reduction in pad spacing or bump pitch for flip chip ball grid array packaging has created challenging requirements for testing each flip chip ball grid array package for open and short circuits. For example, existing technology for bump pitches of 250 microns and 225 microns is already being surpassed by new technology for bump pitches of 200 microns and 180 microns. As the reduction in pad pitch continues, test probe fixtures needed for testing flip chip ball grid array packages for open and short defects such as the Cobra probe become increasingly complex and costly to make. The tooling cost for an open/short test fixture for each new flip chip ball grid array package is currently about $100,000.

SUMMARY OF THE INVENTION

The present invention advantageously addresses the needs above as well as other needs by providing a method and apparatus for making a test fixture for a ball grid array package.

In one embodiment, the invention may be characterized as a method for making a test fixture for a ball grid array package that includes the steps of placing a test ball grid array package in a coarse pitch socket for making electrical contact between a test device and a plurality of wafer bumps formed on a fine pitch surface of the test ball grid array package; coupling the plurality of wafer bumps formed on the fine pitch surface of the test ball grid array package to a first opposite surface of an interposer; placing a subject ball grid array package to be tested in a coarse pitch socket for making electrical contact between the test device and a plurality of contact pads formed on a coarse pitch surface of the subject ball grid array package; and coupling a plurality of wafer bumps formed on a fine pitch surface of the subject ball grid array package to a second opposite surface of the interposer for making electrical contact between the test device and the plurality of wafer bumps formed on the fine pitch surface of the subject ball grid array package.

In another embodiment, the invention may be characterized as a test fixture for a ball grid array package that includes a test ball grid array package having a plurality of coarse pitch contacts formed on a coarse pitch surface of the test ball grid array package and a plurality of wafer bumps formed on a fine pitch surface of the test ball grid array package and an interposer coupled to the plurality of wafer bumps formed on the fine pitch surface of the test ball grid array package for coupling to a plurality of wafer bumps formed on a fine pitch surface of a subject ball grid array package.

The features and advantages summarized above in addition to other aspects of the present invention will become more apparent from the description, presented in conjunction with the following drawings.

BRIEF DESCRIPTION OF THE DRAWINGS

The above and other aspects, features and advantages of the present invention will be more apparent from the following more specific description thereof, presented in conjunction with the following drawings wherein:

FIG. 1 is a side view of a test fixture of the prior art for flip chip ball grid array packages; and FIG. 2 is a side view of a test fixture for flip chip ball grid array packages according to an embodiment of the present invention.

Corresponding reference characters indicate corresponding elements throughout the several views of the drawings.

DETAILED DESCRIPTION OF THE DRAWINGS

The following description is presented to disclose the currently known best mode for making and using the present invention. The scope of the invention is defined by the claims.

FIG. 1 is a side view of a test fixture 100 of the prior art for a flip chip ball grid array package. Shown are probe leads 102, a Cobra probe test fixture 104, wafer bumps 106, a subject flip chip ball grid array (FCBGA) package 108 under test, coarse pitch pads 110, a coarse pitch socket 112, testing equipment 114, and a wire harness 116.

The probe leads 102 of the Cobra probe test fixture 104 connect the testing equipment 114 to each of the wafer bumps 106 formed on the subject flip chip ball grid array (FCBGA) package 108. The Cobra probe is based on buckling beam technology, wherein a metal or an alloy wire inside a plastic housing deflects as it is compressed between a wafer and the test board. Each of the wafer bumps 106 is connected to a corresponding coarse pitch pad 110 formed on the subject flip chip ball grid array package 108. The coarse pitch pads 110 make electrical contact with the coarse pitch socket 112. The coarse pitch socket 112 connects the coarse pitch pads 110 to the testing equipment 114 by the wire harness 116.

The spacing of coarse pitch pads 110, typically about 1.0 mm or 1.27 mm, facilitates electrical connection to the testing equipment 114 with inexpensive sockets such as the coarse pitch socket 112. The design criteria for the spacing of the wafer bumps 106, however, require a bump pitch on the order of 200 microns or less. The close spacing of the wafer bumps 106 drives the tooling cost of the Cobra test fixture 104 that must make electrical contact between each of the wafer bumps 106 and one of the corresponding probe leads 102 that connects each of the wafer bumps 106 to the testing equipment 114. Disadvantages of the Cobra probe include the requirement for a new, expensive test fixture for each design and damage to the wafer bumps from probe indentation.

FIG. 2 is a side view of a test fixture 200 for a flip chip ball grid array package that may be implemented with standard, inexpensive, coarse pitch sockets, such as those commercially available from OZTEK, 3M, and Tyco. Shown are wafer bumps 106, a subject flip chip ball grid array package 108, coarse pitch pads 110, a coarse pitch socket 112, testing equipment 114, a wire harness 116, an interposer 202, test fixture wafer bumps 204, a test fixture flip chip ball grid array package 206, test fixture coarse pitch pads 208, and a coarse pitch test fixture socket 210.

The wafer bumps 106 are formed on the subject flip chip ball grid array package 108 and are connected, for example, by bond wires to the coarse pitch pads 110 according to standard manufacturing techniques well known in the art. The coarse pitch pads 110 formed on the subject flip chip ball grid array package 108 make electrical contact with the coarse pitch socket 112. The coarse pitch socket 112 connects the coarse pitch pads 110 to the testing equipment 114 by the wire harness 116.

The interposer 202 makes electrical contact between the wafer bumps 106 on the subject flip chip ball grid array package 108 and the test fixture wafer bumps 204 on the test fixture flip chip ball grid array package 206. The interposer 202 may be made using a conventional printed circuit fine line fabrication process with plated vias formed by a laser.

The test fixture flip chip ball grid array package 206 may be made using the same manufacturing process as the subject flip chip ball grid array package 108. The test fixture coarse pitch pads 208 on the test fixture flip chip ball grid array package 206 are electrically connected to the test equipment 114 by the coarse pitch test fixture socket 210 and standard wiring such as the wire harness 116. The coarse pitch test fixture socket 210 may be made by the same method as the coarse pitch socket 112.

In operation, the test fixture flip chip ball grid array package 206 is inserted into the coarse pitch test fixture socket 210 and aligned to make electrical contact with the test fixture wafer bumps 204. The subject flip chip ball grid array package 108 is inserted into the coarse pitch socket 112 and is likewise aligned to make electrical contact with the interposer 202. The subject flip chip ball grid array package 108 is thus connected to the test equipment 114 both through the coarse pitch pads 110 and through the wafer bumps 106 by the coarse pitch sockets 112 and 210.

Other modifications, variations, and arrangements of the present invention may be made in accordance with the above teachings other than as specifically described to practice the invention within the spirit and scope defined by the following claims.

What is claimed is:

1. A method for testing for defects in a ball grid array package comprising the following steps:
    placing a test ball grid array package in a coarse pitch socket for making electrical contact between a test device and a plurality of wafer bumps formed on a fine pitch surface of the test ball grid array package;
    coupling the plurality of wafer bumps formed on the fine pitch surface of the test ball grid array package to a first opposite surface of an interposer;
    placing a subject ball grid array package to be tested in a coarse pitch socket for making electrical contact between the test device and a plurality of contact pads formed on a coarse pitch surface of the subject ball grid array package;
    and coupling a plurality of wafer bumps formed on a fine pitch surface of the subject ball grid array package to a second opposite surface of the interposer for making electrical contact between the test device and the plurality of wafer bumps formed on the fine pitch surface of the subject ball grid array package.

2. A method for making a test fixture for a ball grid array package comprising the following steps:
    coupling a plurality of coarse pitch contacts formed on a coarse pitch surface of a test ball grid array package to a plurality of wafer bumps formed on a fine pitch surface of the test ball grid array package;
    coupling the plurality of wafer bumps formed on the fine pitch surface of the test ball grid array package to a plurality of wafer bumps formed on a first opposite surface of an interposer; and
    coupling a plurality of wafer bumps formed on a second opposite surface of the interposer to a plurality of wafer bumps formed on a fine pitch surface of a subject ball grid array package.

3. The method of claim 2 further comprising the step of coupling the plurality of coarse pitch contacts formed on the coarse pitch surface of the test ball grid array package to a coarse pitch socket.

4. The method of claim 2 further comprising the step of coupling a plurality of coarse pitch contacts formed on a coarse pitch surface of the subject ball grid array package to a coarse pitch socket.

5. A test fixture for a ball grid array package comprising:
    a test ball grid array package having a plurality of coarse pitch contacts formed on a coarse pitch surface of the test ball grid array package and a plurality of wafer bumps formed on a fine pitch surface of the test ball grid array package; and
    an interposer coupled to the plurality of wafer bumps formed on the fine pitch surface of the test ball grid array package for coupling to a plurality of wafer bumps formed on a fine pitch surface of a subject ball grid array package.

6. The test fixture of claim 5 further comprising a coarse pitch socket for coupling a test device to a plurality of coarse contacts formed on a coarse pitch surface of the subject ball grid array package.

7. The test fixture of claim 5 further comprising a coarse pitch socket for coupling a test device to the plurality of coarse contacts formed on the coarse pitch surface of the test ball grid array package.

* * * * *